US011495317B2

(12) United States Patent
Vigilante et al.

(10) Patent No.: US 11,495,317 B2
(45) Date of Patent: Nov. 8, 2022

(54) MANAGED-NAND REAL TIME ANALYZER AND METHOD

(71) Applicant: Micron Technology, Inc., Boise, ID (US)

(72) Inventors: Andrea Vigilante, Milan (IT); Gianluca Scalisi, Castelverde (IT)

(73) Assignee: Micron Technology, Inc., Boise, ID (US)

( * ) Notice: Subject to any disclaimer, the term of this patent is extended or adjusted under 35 U.S.C. 154(b) by 736 days.

(21) Appl. No.: 16/453,712

(22) Filed: Jun. 26, 2019

(65) Prior Publication Data

US 2020/0411127 A1   Dec. 31, 2020

(51) Int. Cl.
| | | |
|---|---|---|
| *G11C 29/18* | (2006.01) | |
| *G06F 13/16* | (2006.01) | |
| *G11C 29/16* | (2006.01) | |
| *G06F 12/02* | (2006.01) | |

(52) U.S. Cl.
CPC .......... *G11C 29/18* (2013.01); *G06F 13/1668* (2013.01); *G11C 29/16* (2013.01); *G06F 12/0246* (2013.01)

(58) Field of Classification Search
CPC ......... G11C 29/18; G11C 29/16; G11C 29/56; G11C 29/56008; G11C 2029/5602; G06F 13/1668; G06F 12/0246; G06F 2212/1016; G06F 2212/7208
See application file for complete search history.

(56) References Cited

U.S. PATENT DOCUMENTS

| | | | |
|---|---|---|---|
| 6,473,871 B1 | 10/2002 | Coyle et al. | |
| 8,356,214 B2* | 1/2013 | Do | G11C 29/1201 |
| | | | 714/724 |
| 10,430,117 B2* | 10/2019 | Jean | G06F 12/0246 |
| 2009/0003103 A1 | 1/2009 | Shimizu et al. | |
| 2017/0004063 A1 | 1/2017 | Broderick et al. | |

(Continued)

FOREIGN PATENT DOCUMENTS

| | | |
|---|---|---|
| CN | 112151105 A | 12/2020 |
| TW | 202101469 A | 1/2021 |

OTHER PUBLICATIONS

"Exploring Managed NAND Media Endurance" by Mark Jurenka, Thesis, Boise State University, May 2010 (Year: 2010).*

(Continued)

*Primary Examiner* — Cynthia Britt
(74) *Attorney, Agent, or Firm* — Schwegman Lundberg & Woessner, P.A.

(57) ABSTRACT

A testing device comprises test interface circuitry, probe circuitry, and initiate state machine circuitry. The test interface circuitry is configured to receive NAND signaling when operatively coupled to a M-NAND memory device under test and to operate the M-NAND memory device under test to receive memory access requests and to provide status or data at the same rate it receives memory access requests. The probe circuitry is configured to detect memory operations of the memory device under test. The finite state machine circuitry is operatively coupled to the probe circuitry and is configured to advance through multiple circuit states according to the detected memory operations; and log memory events of the memory device under test according to the circuit states.

25 Claims, 9 Drawing Sheets

(56) References Cited

U.S. PATENT DOCUMENTS

2019/0066815 A1    2/2019   Chiu et al.
2020/0402553 A1*   12/2020  Koh ..................... G11C 16/26
2020/0411129 A1    12/2020  Vigilante et al.

OTHER PUBLICATIONS

"Korean Application Serial No. 10-2020-0077077, Notice of Preliminary Rejection dated Jun. 17, 2021", w/ English translation, 5 pgs.
"Taiwanese Application Serial No. 109114442, Office Action dated Apr. 19, 2021", w/ English Translation, 29 pgs.
"Taiwanese Application Serial No. 109114442, Voluntary Amendment Filed Oct. 29, 2020", w/ English Claims, 57 pgs.

* cited by examiner

980

STATE ERROR FLAG FOR CH0 IS: 0

THE NUMBER OF OPERATIONS FOR CHANNEL_0:

|  | TOTAL | NAND0 | NAND1 | NAND2 | NAND3 |
|---|---|---|---|---|---|
| THE NUMBER OF RESET FOR CH0 IS: | 0 | 0 | 0 | 0 | 0 |
| THE NUMBER OF SYNCHRONOUS RESET FOR CH0 IS: | 0 | 0 | 0 | 0 | 0 |
| THE NUMBER OF RESET LUN FOR CH0 IS: | 0 | 0 | 0 | 0 | 0 |
| THE NUMBER OF READ ID FOR CH0 IS: | 74 | 37 | 37 | 0 | 0 |
| THE NUMBER OF GET/SET FEATURES FOR CH0 IS: | 450 | 225 | 225 | 0 | 0 |
| THE NUMBER OF READ STATUS FOR CH0 IS: | 310726 | 159612 | 151114 | 0 | 0 |

982

ERASE BLOCK MULTIPLANE DISTRIBUTION FOR NAND_0

| NUM. OF OPERATIONS | BLOCK |
|---|---|
| 1 | 8 |
| 1 | 9 |
| 1 | 10 |
| 1 | 11 |
| 1 | 12 |
| 1 | 13 |
| 1 | 1372 |

984

| NAND | OPERATION | ADD0 | ADD1 | ADD2 | ADD3 | ADD4 | ADD5 | COLUMN | PAGE | BLOCK | TIMER |
|---|---|---|---|---|---|---|---|---|---|---|---|
| 1 | 5 | 0 | 0 | 89 | 180 | 23 | 0 | 0 | 89 | 1517 | 3999925357 |
| 1 | 3 | 0 | 0 | 93 | 16 | 23 | 0 | 0 | 93 | 1476 | 3999824506 |
| 0 | 0 | 64 | 0 | 89 | 180 | 23 | 0 | 64 | 89 | 1517 | 3380890127 |

*Fig. 9*

MANAGED-NAND REAL TIME ANALYZER AND METHOD

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc. SSD, UFS, and eMMC devise can be managed NAND (M-NAND) memory devices that include processing circuitry such as memory controllers, direct memory access (DMA) controllers, and flash memory interface circuitry to manage the access to physical memory.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 9 is an example of one or more display screens that present statistics collected by a testing system according to some examples described herein.

DETAILED DESCRIPTION

Memory devices can include arrays of memory cells. The memory cells are accessed using access lines and data lines. Memory events such as memory read and memory program operations typically involve charging the access lines and data lines of a memory array. To assess performance of an electronic system, it can be useful to monitor other statistics of the memory device, such as the number and type of memory operations being performed, the status of the operations returned by the device, and the physical addresses being accessed to assess wear. However, the memory device testing is not performed in real time. When operated in real time, such as when the memory device is being accessed by a mobile phone or other electronic system, the memory device receives memory access requests and provides status or data at the same rate it receives memory access requests. Instead of real time, conventional testers and logic analyzers perform short test routines to test the memory devices. These test routines typically perform memory operations slower than in real time, the operations may be interrupted before completing to collect data, and the test time is limited. Thus, it may not be possible to assess and characterize the true performance of the memory device in an embedded electronic system.

As a result, some examples described herein include various structures and methods for operating a managed-NAND (M-NAND) testing device to receive memory access requests from a memory controller in real time and to provide one or both of status and data in response to the memory access requests in real time (e.g., it provides responses at the same rate it receives the memory access requests). The testing device monitors a NAND memory bus of the M-NAND memory device using test pads of the M-NAND memory device, and detects memory operations of the M-NAND memory device under test. The testing device is advanced through multiple states according to the detected memory operations and logs memory access events according to the multiple states advanced through.

Figure 1:
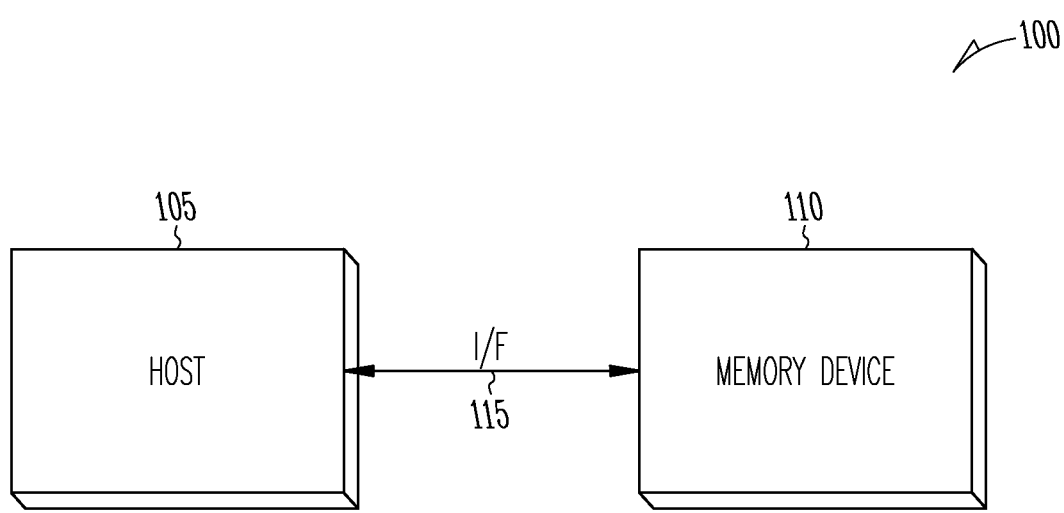
FIG. 1 illustrates an example system including a host and a memory device according to some examples described herein.

FIG. 1 illustrates an example system 100 including a host 105 and a memory device 110. The host 105 can include a host processor, a central processing unit, or one or more other device, processor, or controller. The memory device 110 can include a universal flash storage (UFS) device, an embedded MMC (eMMC™) device, or one or more other memory devices. The host 105 and the memory device 110 can communicate using a communication interface (I/F) 115 (e.g., a bidirectional parallel or serial communication interface).

In an example, the memory device 110 can include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC™ device, and the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the memory device 110 can include one or more other memory devices, or the communication interface 115 can include one or more other interfaces, depending on the host 105 and the memory device 110. The identified standards are provided only as example environments in which the described methods and structures may be utilized; but such methods and structures may be utilized in a variety of environments outside of the identified standards (or of any actual or proposed standards).

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain examples, the memory array can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
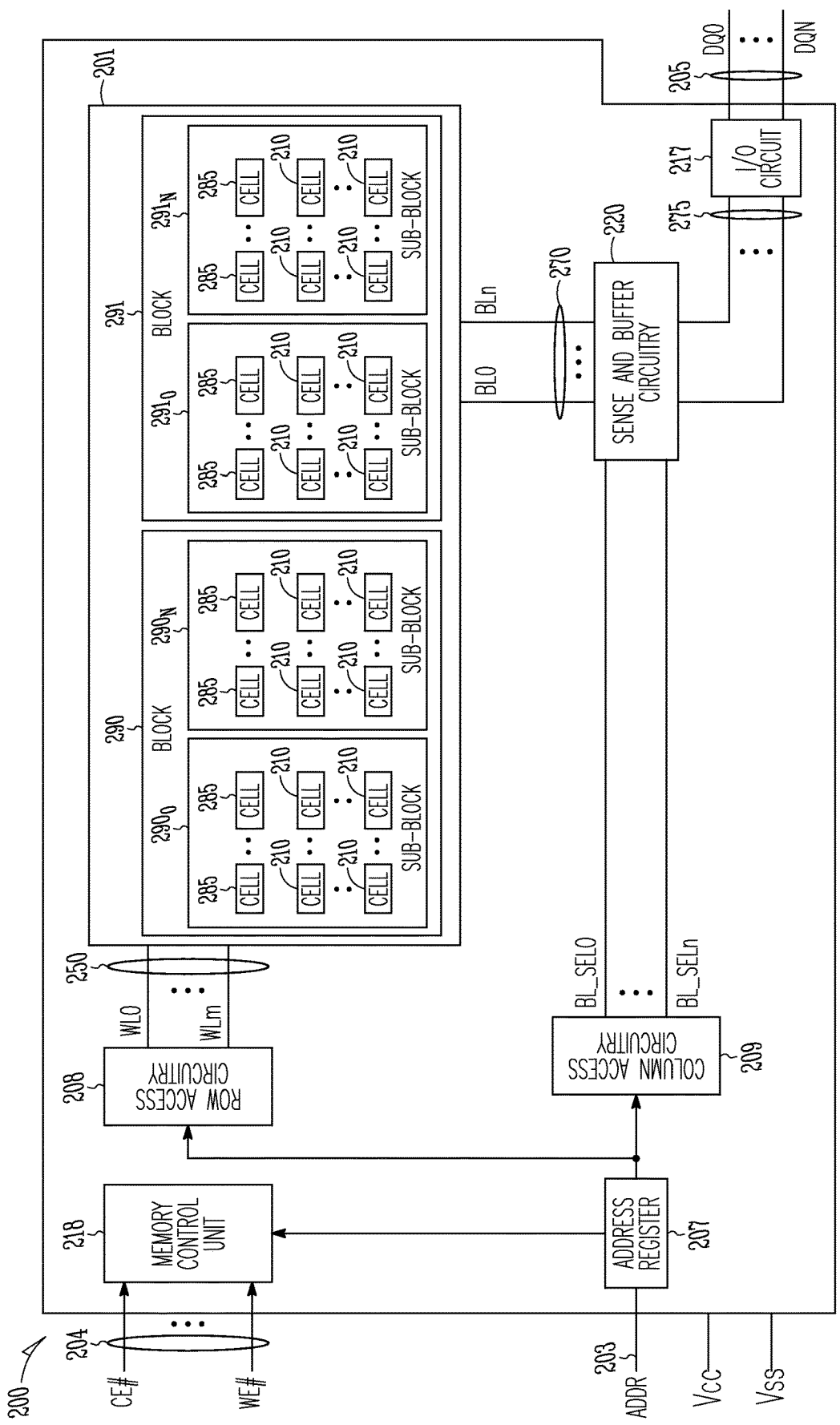
FIG. 2 is a block diagram of an apparatus in the form of a memory device including non-volatile memory cells according to some examples described herein.

FIG. 2 shows a block diagram of an apparatus in the form of a memory device 200 (e.g., memory device 110 in FIG. 1) including non-volatile memory cells having mixed memory cell types integrated in the same integrated circuit (IC) chip, according to some examples described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include components such as a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE #, a write enable signal WE #) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller, memory control unit, or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

In memory device 200, memory cells 210 can be configured to store information (e.g., user data). Memory cells 285 may not be configured to permanently store information such as user information, but they may be used by memory device 200 as temporary storage cells during an operation (e.g., a write operation) of storing information (e.g., user data) in memory cells 210 in order to improve operations of memory device 200.

In a packaged NAND device test pads may be available on the packed device. With a typical NAND tester, the test pads are used for failure analysis (NAND Testing Mode) or for debugging mode (NAND Verification Mode). However, as explained above, it can be useful to test memory devices in real time while embedded in an electronic system such as a mobile phone. Capturing the signals available on the test pads of a NAND (e.g., eMMC or UFS) may allow for a testing device to make a real-time recording of the signals and operation of the memory device.

Figure 3:
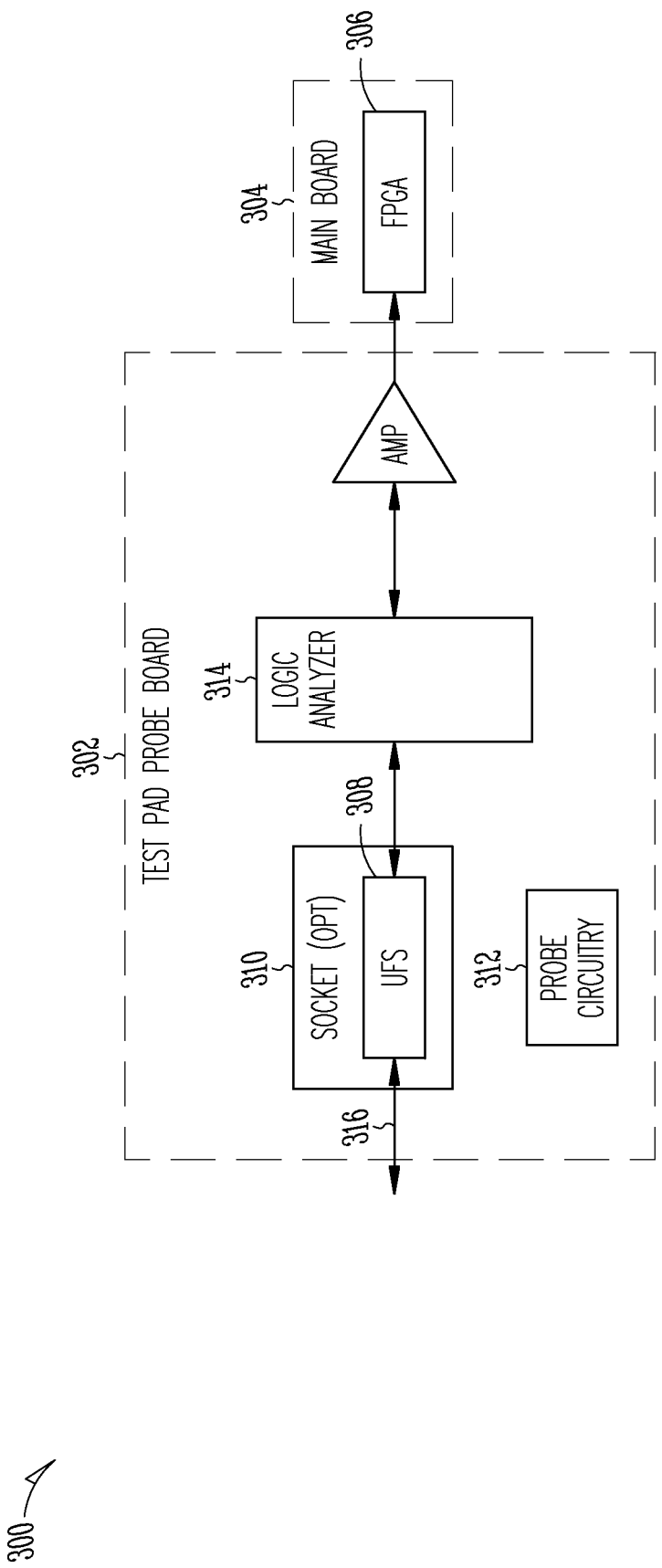
FIG. 3 is a block diagram of portions of an M-NAND testing system according to some examples described herein.

FIG. 3 is a block diagram of portions of an example of a M-NAND testing system 300. The system may include a test pad probe board 302, and a main board 304 that includes an FPGA 306. The test pad probe board 302 is an interface from the testing system to the M-NAND memory device under test (e.g., UFS device 308 in FIG. 3) and the test pad probe board can include a test socket 310. The test pad probe board 302 may include probe circuitry 312 that detects the signals associated with memory operations of the M-NAND memory device under test. The test pad probe board 302 includes a test interface 316 (I/F) for an electronic system in which the M-NAND memory device is to be embedded or a surrogate of the electronic system. For example, test interface 316 may be electrically coupled to a mobile phone that operates the M-NAND memory device under test in real time. The test pad probe board 302 may also include a logic analyzer connector 314. The FPGA 306 may include one or both of logic circuitry and processing circuitry to process information related to the detected memory operations and may provide an interface to other peripheral devices (not shown).

Figure 4:
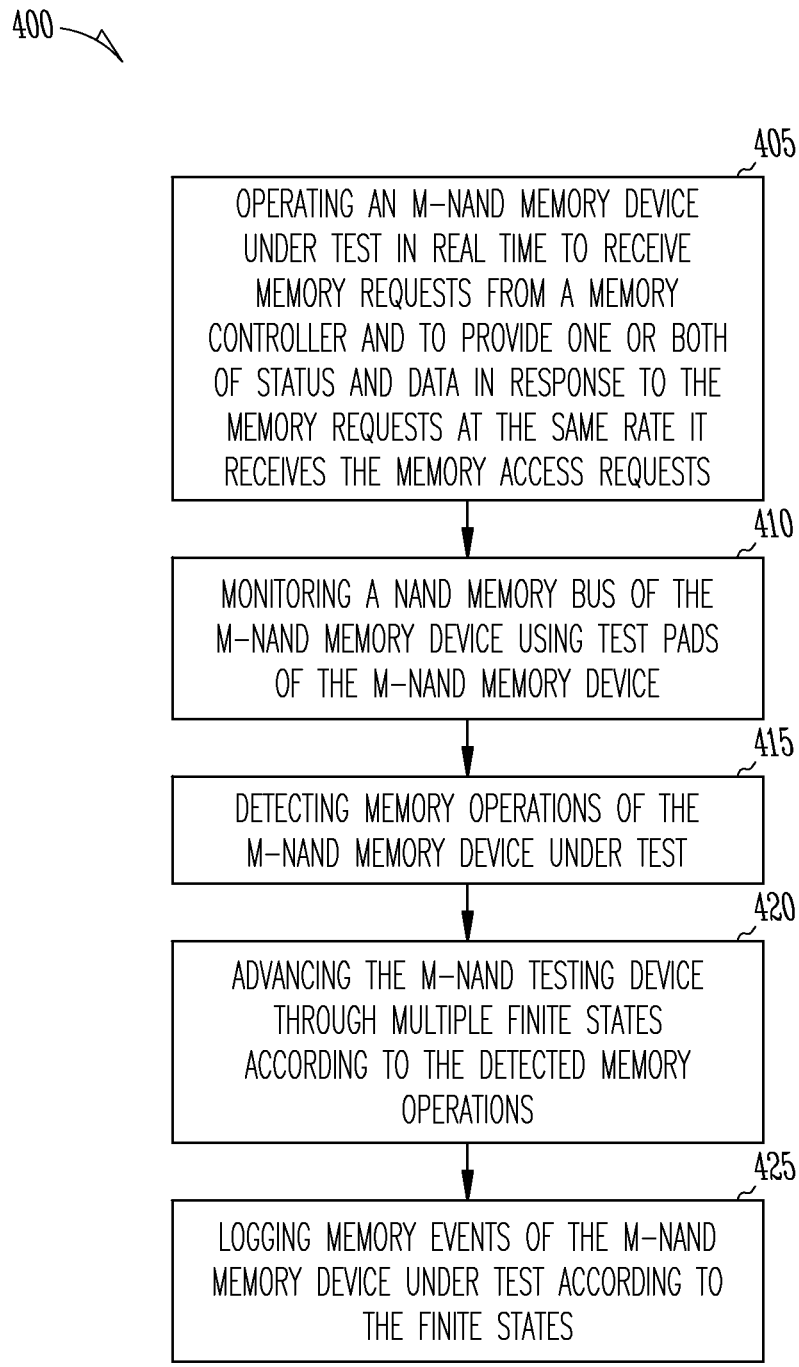
FIG. 4 is a flow diagram of an example of a method of operating a testing device according to some examples described herein.

FIG. 4 is a flow diagram of a method of operating a managed-NAND (M-NAND) testing device. At 405, a M-NAND memory device under test is operated in real time. That is, the M-NAND device is operated to receive memory access requests from a memory controller and to provide one or both of status and data in response to the memory access requests at the same rate it receives the memory access requests. For example, the requests and responses are exchanged at the same rate as in the end device (e.g., a mobile phone). At 410, a NAND memory bus of the M-NAND memory device is monitored using test pads of the M-NAND memory device. At 415, memory operations of the M-NAND memory device under test are detected, such as by using probe circuitry of the test pad probe board. At 420, the testing device is advanced through multiple finite states according to the detected memory operations. The testing device can perform various functions according to a particular state of the testing device. For example, at 425 the testing device may log memory events of the M-NAND memory device under test according to the finite states.

Figure 5:
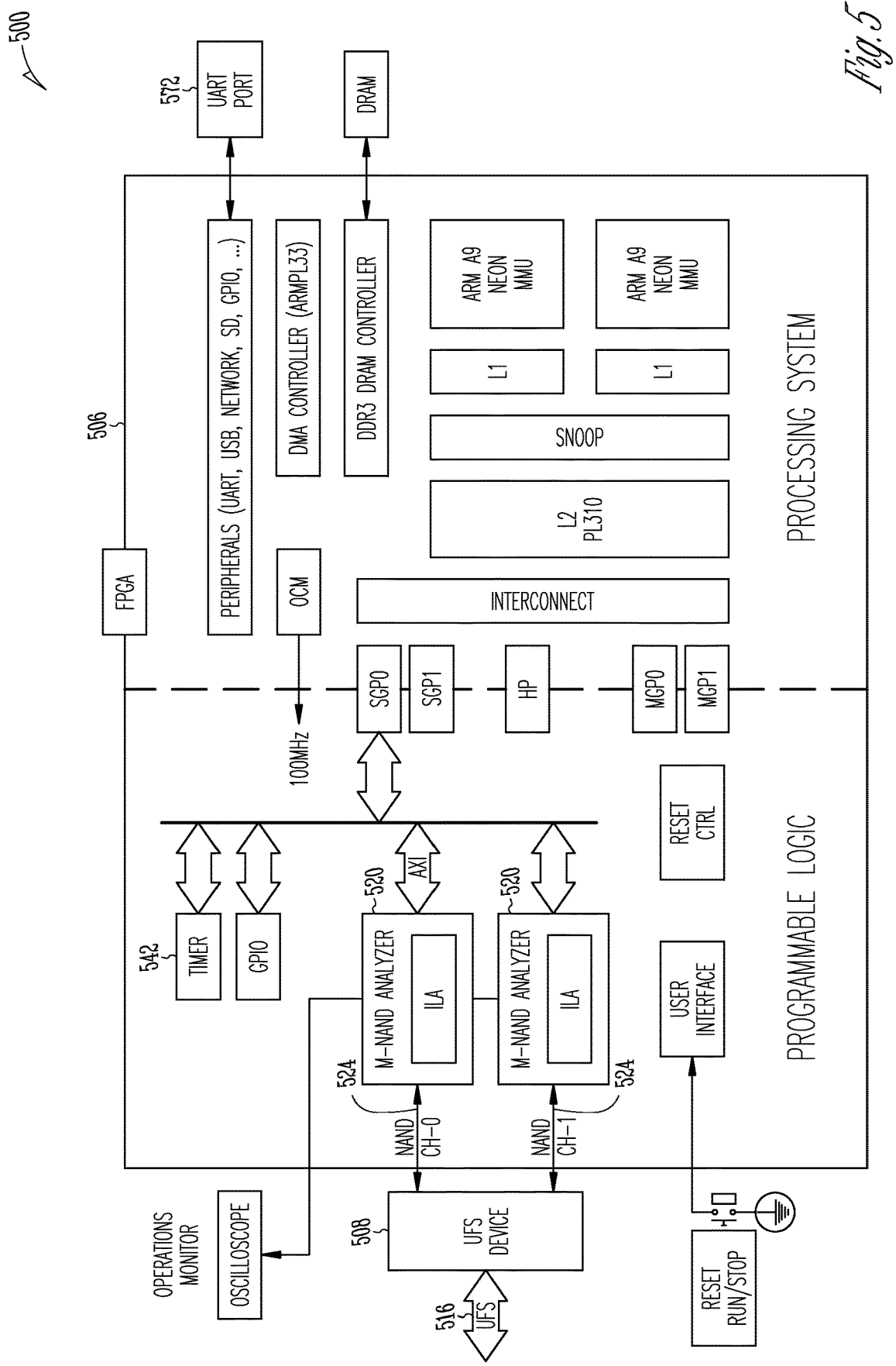
FIG. 5 is a block diagram of portions of an example of a managed-NAND (M-NAND) testing system according to some examples described herein.

FIG. 5 is a block diagram of portions of an example of an M-NAND testing system 500. The example in FIG. 5 shows an FPGA 506 and a M-NAND memory device 508 under test (e.g., UFS device). The FPGA 506 includes logic circuitry and processing system circuitry. The logic circuitry may be programmable, and the processing system circuitry can include one or more processors. The testing system also includes test interface circuitry 516. The test interface circuitry 516 may be connectable to an electronic system. The test interface circuitry 516 receives signaling from the electronic system to operate the M-NAND memory device under test in real time, such as for example by operating the M-NAND memory device to receive memory access requests in real time and to provide status or data at the same rate it receives memory access requests. The testing system 500 detects NAND memory operations of the M-NAND memory device under test, such as by using probe circuitry to monitor test pads of the M-NAND device under test.

Figure 6:
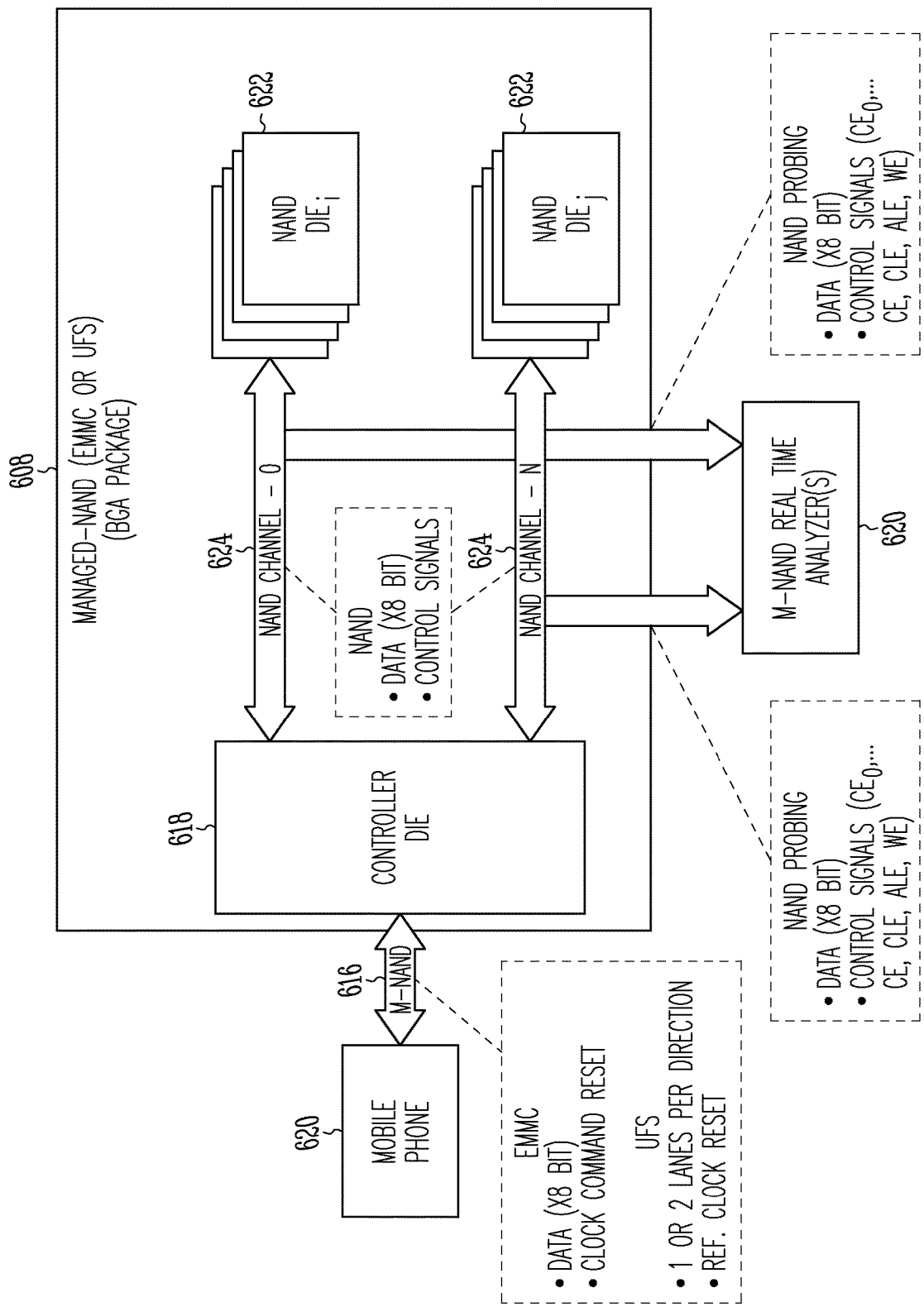
FIG. 6 is a block diagram of an example of an M-NAND memory device under test by a testing system according to some examples described herein.

FIG. 6 is a block diagram of an example of an M-NAND memory device under test by the testing system 500 of FIG. 5. The M-NAND memory device 608 may be an eMMC or UFS memory device and may be packaged in a ball grid array (BGA) package. The M-NAND memory device 608 is connected by an interface 616 to an electronic system in which the M-NAND device is to be embedded (e.g., mobile phone 620). The M-NAND memory device 608 includes a memory controller die 618 and multiple memory dice 622. The memory dice can include one or more memory arrays. The memory controller 618 accesses the memory dice using multiple data channels 624 (NAND Channels 0 to N, where N is an integer greater than one). The data channels can be monitored using the test pads of the M-NAND memory device. For example, the probe circuitry of a test pad probe board of the testing system 500 can detect NAND memory access requests from the memory controller operating to process requests of the electronic system. The data channels 624 are monitored by one or more M0AND analyzers 620 of the FPGA. In the example of FIG. 5, there are two data channels 524 of the M-NAND memory device (CH-1 and CH-0) being monitored by the FPGA 506. The FPGA 506 can include an M-NAND analyzer 520 for each of the data channels of the M-NAND memory device 508.

Figure 7:
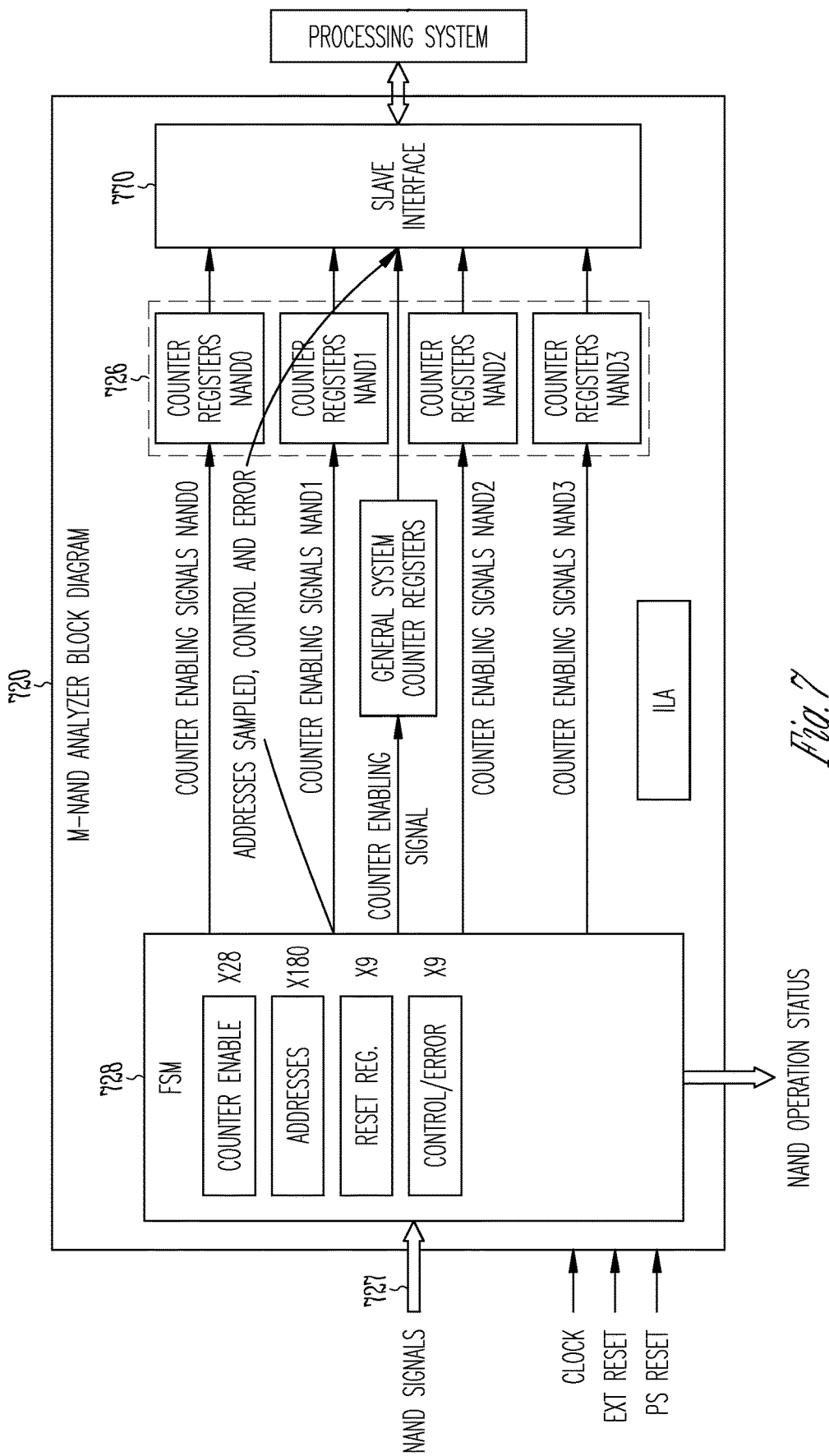
FIG. 7 is a block diagram of an example of an M-NAND analyzer according to some examples described herein.

FIG. 7 is a block diagram of an example of an M-NAND analyzer 720. The M-NAND analyzer 720 includes finite state machine (FSM) circuitry. The finite state machine circuitry 728 can be included in one or both of the logic circuitry and processing system circuitry of the FPGA 506 of FIG. 5. The finite state machine circuitry 728 receives NAND signals 727 that are detected on a data channel. The finite state machine circuitry 728 identifies memory operations using the NAND signals 727 and advances through multiple circuit states according to the detected memory operations.

Memory events of the M-NAND memory device under test are logged according to the circuit states. The M-NAND analyzer 720 can include multiple counters and registers. The M-NAND analyzer 720 may include a set of counters and registers 726 for each memory die. In the Example of FIG. 7, the M-NAND Analyzer includes a counter and registers for each of four memory dice (NAND0 through NAND3). A particular state of the M-NAND analyzer 720 may become active in response to a detected memory operation or a sequence of memory operations. The finite state machine circuitry 728 may record or log the events related to the memory operations by sending counter enable signaling to the counters and registers 726. The probe circuitry may detect memory operations to each of the memory dice of the memory device under test such as by monitoring chip enable (CE) signals or chip select (CS) signals. The access to the memory dice is logged by the M-NAND analyzer 720.

Figure 8:
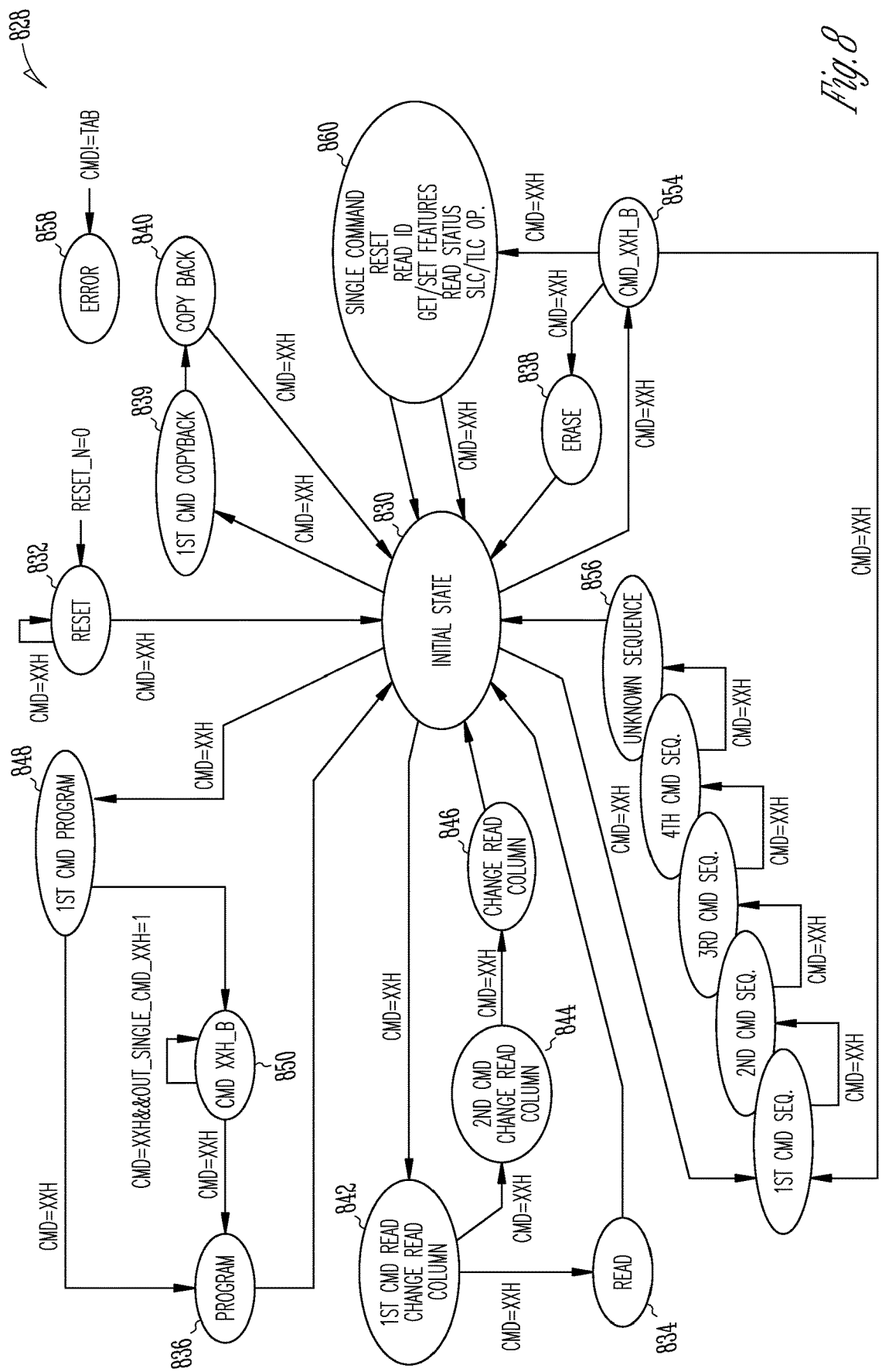
FIG. 8 is an example of a finite state machine that can be implemented in a M-NAND analyzer according to some examples described herein.

FIG. 8 is an example of a finite state machine 828 that can be implemented by the finite state machine circuitry of a M-NAND analyzer. Some of the circuit states of the finite state machine 828 correspond to memory operations such as memory RESET 832, memory READ 834, memory write or PROGRAM 836, memory ERASE 838, and COPYBACK 840. Some circuit states are intermediate states that correspond to NAND memory commands used by the memory controller to perform the memory operations. For example, when the M-NAND memory device performs a memory read operation, the state machine of the testing device traverses a logical path that includes circuit states corresponding to a first COMMAND CHANGE READ COLUMN 842, READ 834, and back to the INITIAL STATE 830. Alternatively, the state machine may traverse a logical path that includes the first COMMAND CHANGE READ COLUMN 842, second COMMAND CHANGE READ COLUMN 844, CHANGE READ COLUMN 846, and back to INITIAL STATE 830. Thus, the circuit states are traversed according to the NAND memory commands detected. The probe circuitry of the testing device may detect the NAND memory commands using the test pads. The finite state machine 828 advances through the multiple circuit states according to the detected NAND memory commands and the detected memory operations are logged by the finite state machine circuitry. The logging of the memory operation can include logging of the NAND memory commands of the intermediate states. Thus the logical paths traversed by the finite state machine can be logged.

In another example, when the M-NAND memory device performs a program operation, the state machine of the testing device traverses a logical path that includes states corresponding to a first COMMAND PROGRAM 848, PROGRAM 836, and back to INITIAL STATE 830. Alternatively, the state machine may traverse a logical path that includes the first COMMAND PROGRAM 848, state 850 to PROGRAM 836, and back to INITIAL STATE. State 850 may include performing single commands that keeps the state machine in state 850 for multiple command cycles. The finite state machine circuitry logs the PROGRAM operations and may log the memory commands performed in association with the PROGRAM operations.

In further examples, when the M-NAND memory device performs a copyback operation, the state machine of the testing device may traverse a logical path that includes states corresponding to first COPYBACK command 839, to COPYBACK 840, and back to initial state 830. When the M-NAND memory device performs an erase operation, the finite state machine 828 may traverse a logical path that includes circuit states corresponding to state 854, to ERASE state 838, and back to INITIAL STATE 830. Other circuit states include ERROR state 858.

The finite state machine 828 may include an UNKNOWN command sequence state 856. For an unknown command sequence, the state machine may traverse a logic path that includes multiple unknown commands in a sequence. The example of FIG. 8 shows a sequence of four commands to arrive at unknown command sequence state 856. The state machine of the testing device can include a SINGLE COMMAND state 860. The state machine may arrive at state 860 when performing single command memory operations such as Read ID, Get/Set operations, Read Status operations, single level cell (SLC) operations, triple level cell (TLC) operations, etc. The finite state machine circuitry logs the single command memory operation and returns to INITIAL STATE 830.

Returning to FIG. 7, the finite state machine circuitry 728 may be implemented in programmable logic circuitry of the FPGA 506 of FIG. 5. Thus, the logic of the finite state machine circuitry 728 can be reconfigurable to log operations of different designs of memory devices. In some examples, the probe circuitry and M-NAND analyzer 720 detect the physical NAND memory addresses accessed by the NAND memory commands. The finite state machine circuitry 728 logs the detected physical memory address in association with one or both of memory operations and the NAND memory commands. Because the memory controller of the M-NAND memory device may translate the logical addresses to physical addresses, logging the physical addresses accessed using the data channels can provide useful information related to the distribution of the memory operations in the physical memory address space. Using the counters and registers 726, the finite state machine circuitry 728 may log one or more of memory accesses to each memory die, memory commands associated with a memory access to each memory die, physical addresses associated with the memory access to each memory die, and the status of the memory access to each memory die. The M-NAND analyzer may also log the state of timer 542 of FIG. 5 for the memory accesses.

The M-NAND analyzer 720 can include a slave interface 770. The processing system circuitry of the testing system of FIG. 5 can access the counters and registers 726 of the M-NAND analyzer 720 via the slave interface 770. The information logged in the counters and registers 726 by the finite state machine circuitry 728 can include the memory operations for which the physical addresses have been sampled, an identifier for the type of each of the memory operations, the memory die on which a memory operation was performed, the physical address sampled in each address cycle, the column, page, and block accessed by each memory operation, and the timing distribution of each memory operation.

The processing system circuitry of the testing system 500 in FIG. 5 can process the information of the M-NAND analyzer to generate statistics on the memory operations of the M-NAND memory device 508. Some examples of the statistics that can be generated by testing system 500 include the number of each type of memory operation performed on each data channel of the M-NAND memory device and the distribution among the memory dice of the M-NAND memory device. Thus, the statistics can provide information to a user of how well each of the memory die is used. Another statistic example is the distribution of the memory operations in the physical memory space of each of the memory dies. Thus, the generated statistics can provide information on how well the memory operations used the physical address space within each memory die. The testing system 500 can include a port (e.g., universal asynchronous receiver-transmitter (UART) port 572) to interface to peripheral devices. A peripheral device may be used to present the statistics to a user, or the testing system 500 can include a display, such as a display of a user interface of the testing system for example.

FIG. 9 is an example of one or more display screens that can be used to present the statistics collected by the testing system 500 to a user. Display 980 shows the types of memory operations logged by the testing system for data channel zero (CH0) of the M-NAND memory device. Display 980 also shows the number of the different types of memory operations performed. The memory operations include RESET, Synchronous RESET, reset logical unit (RESET LUN), READ ID, GET/SET FEATURES, and READ STATUS. Display 980 also shows the ERROR state for CH0. Display 980 further shows the distribution of the memory operations among the memory dice of the M-NAND device (NAND0-NAND3). The distribution presented shows that the memory dice NAND2 and NAND3 were not utilized for the memory operations. Using this information, a designer may revise firmware of the memory controller of the M-NAND device to improve the distribution of the memory operations among the memory dice.

Display 982 shows the ERASE operation distribution within memory die NAND0. The distribution for blocks of memory within NAND0 is displayed. The distribution for pages of a memory die may optionally be shown. Display 984 shows a more detailed breakdown of the memory operations. Each line of the display presents the memory die accessed and the ID number or tag of the memory operation. For example, memory operation "3" may indicate a program page operation. Each line of the display also shows the addresses accessed, the column, page, and block of the memory accessed, and a timer value showing the time distribution of the memory operations.

The memory operations are logged in real time by the testing device rather than using a slower operating clock or adding steps to allow data to be captured. Testing in real time may uncover boundary timing problems or other bugs in the interaction with the memory controller and the memory dice, or in the interaction between the electronic system and the M-NAND memory device. The operation of the M-NAND memory device firmware can be characterized while being operated by an end device, such as a mobile phone for example. Thus, the operation of the M-NAND memory device can be evaluated in real time embedded operation with the end device. The testing system may also run tests for longer periods of time than is possible with conventional analytical tools such as a logic analyzer. Theoretically, the test duration could run for as long as a user would like. As explained previously herein, the logged information can be useful to characterize the firmware of the memory controller. A designer can revise the firmware to redistribute the memory operations if the memory controller is not implementing good distribution throughout the physical memory address space of the memory device. This can lead to improved wear of the memory die and longer working life of the M-NAND memory device.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Although the implementation of the testing system 500 of the example in FIG. 5 is implemented using an FPGA, the testing system 500 can be implemented in other ways. For example, one or both of the processing system circuitry and the logic circuitry of the testing system 500 may include a processing device (e.g., a hardware processor, a central processing unit (CPU), a hardware processor core, intellectual property (IP) core, or any combination thereof), and memory such as dynamic rando access memory (DRAM), a double data rate (DDR) DRAM controller, and direct memory access (DMA) controller. The processing system circuitry can represent one or more general-purpose processing devices such as a microprocessor, a central processing unit, or the like. The processing system circuitry may also include an application specific integrated circuit (ASIC). The processing system circuitry can be configured to execute instructions for performing the operations and steps discussed herein. One or both the processing circuitry and the logic circuitry of the testing system 500 may be represented in a hardware description language (HDL) stored on computer readable media.

The testing system 500 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The testing system 500 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). The testing system 500 may further still include a network interface device to communicate over a network.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

ADDITIONAL DESCRIPTION AND EXAMPLES

Example 1 includes subject matter (such as a testing device) comprising test interface circuitry is configured to receive NAND signaling when operatively coupled to a M-NAND memory device under test and to operate the M-NAND memory device under test to receive memory access requests and to provide status or data at the same rate it receives memory access requests; probe circuitry configured to detect memory operations of the memory device under test; and finite state machine circuitry operatively coupled to the probe circuitry and configured to: advance through multiple circuit states according to the detected memory operations; and log memory events of the memory device under test according to the circuit states.

In Example 2, the subject matter of Example 1 optionally includes probe circuitry configured to detect NAND memory commands associated with the detected memory operations; and finite state machine circuitry configured to advance through the multiple circuit states according to the detected NAND memory commands and log the detected NAND memory operations.

In Example 3, the subject matter of Example 2 optionally includes probe circuitry configured to detect NAND physical memory addresses accessed in association with the detected NAND memory commands; and finite state machine circuitry configured to log a detected physical memory address in association with a detected NAND memory command.

In Example 4, the subject matter of one or any combination of Examples 1-3 optionally includes a processing circuitry and a display, wherein the processing circuitry is configured to display a distribution of types of memory operations performed in a physical address space.

In Example 5, the subject matter of one or any combination of Examples 1-4 optionally includes probe circuitry configured to detect memory operations of multiple memory dice of the memory device under test; and finite state machine circuitry configured to log memory accesses to each memory die of the multiple memory dice, log one or more commands associated with a memory access to each memory die, log a physical address associated with the memory access to each memory die, and log a status of the memory access to each memory die.

In Example 6, the subject matter of Example 5 includes processing circuitry and a display, wherein the processing circuitry is configured to display one or more of: a number of memory accesses to each memory die of the multiple memory dice; types of commands and a number of the types of commands associated with the memory accesses to each memory die; physical addresses associated with the memory accesses to each memory die; and status associated with the memory accesses to each memory die.

In Example 7, the subject matter of one or any combination of Examples 1-6 optionally includes test interface circuitry is configured to receive signaling via test pads of the M-NAND memory device to operate a NAND memory bus of the M-NAND memory device as the memory device under test. The M-NAND memory device optionally includes multiple data channels internal to the M-NAND memory device and the probe circuitry is configured to detect memory operations communicated via the multiple data channels. The finite state machine circuitry optionally includes a finite state machine for each data channel of the multiple data channels of the M-NAND memory device, and each finite state machine is configured to: advance through multiple circuit states according to detected memory operations of a corresponding data channel of the multiple data channels; and log memory events of the multiple data channels according to the multiple circuit states.

In Example 8, the subject matter of one or any combination of Examples 1-7 optionally includes test interface circuitry configured to operate the M-NAND memory device under test embedded in an electronic system and receive signaling via test pads of the M-NAND memory device when embedded in the electronic system; and probe circuitry configured to detect NAND memory access requests from an internal memory controller of the M-NAND memory device embedded in the electronic system.

In Example 9, the subject matter of Example 8 optionally includes an electronic system that is a mobile phone system.

Example 10 includes subject matter (such as a method of operating a managed-NAND (M-NAND) testing device, or a non-transitory computer readable storage medium including instructions that cause a memory device to perform acts), or can optionally be combined with one or any combination of Examples 1-9 to include such subject matter, comprising: operating a M-NAND memory device under test to receive memory access requests from a memory controller and to provide one or both of status and data in response to the memory access requests at the same rate it receives the memory access requests; monitoring a NAND memory bus of the M-NAND memory device using test pads of the M-NAND memory device;
detecting memory operations of the M-NAND memory device under test; advancing the M-NAND testing device through multiple circuit states according to the detected memory operations; and logging memory events of the M-NAND memory device under test according to the circuit states.

In Example 11, the subject matter of Example 10 optionally includes advancing the M-NAND testing device through the multiple circuit states according to memory commands detected by the testing device; and logging the detected memory operations defined by one or more of the memory commands.

In Example 12, the subject matter of Example 11 optionally includes logging a physical memory address accessed in association with a detected memory operation.

In Example 13, the subject matter of Example 12 optionally includes displaying a distribution of types of memory operations performed in a physical address space.

In Example 14, the subject matter of one or any combination of Examples 10-13 optionally includes detecting memory operations of multiple memory dice of the M-NAND memory device under test, advancing the M-NAND testing device through the multiple circuit states according to memory commands detected by the M-NAND testing device and associated with the memory operations, and logging memory accesses to each memory die of the multiple memory dice, logging one or more memory operations associated with a memory access to the memory die, logging a physical address associated with the memory access to the memory die, and logging a status of the memory access to the memory die.

In Example 15, the subject matter of Example 14 optionally includes displaying one or more of: a number of memory accesses to each memory die of the multiple memory dice; types of memory operations and a number of the types of memory operations associated with the memory accesses to each memory die of the multiple memory dice; physical addresses associated with the memory accesses to each memory die of the multiple memory dice; and status associated with the memory accesses to each memory die of the multiple memory dice.

In Example 16, the subject matter of one or any combination of Examples 10-15 optionally includes operating a universal flash storage (UFS) device or an embedded MultiMediaCard (eMMC) device having multiple data channels internally connecting a memory controller to one or more NAND memory devices; detecting memory operations communicated via the multiple data channels; advancing each of multiple finite state machines of the testing device through multiple circuit states according to detected memory operations of a corresponding data channel of the multiple data channels; and logging memory events of the multiple data channels according to circuit states of each of the multiple finite state machines.

In Example 17, the subject matter of one or any combination of Examples 10-16 optionally includes operating a universal flash storage (UFS) device embedded in an electronic system to receive memory access requests from the electronic system and to provide one or both of status and data to the electronic system at the same rate it receives memory access requests.

In Example 18, the subject matter of one or any combination of Examples 10-17 optionally includes operating a universal flash storage (UFS) device or an embedded MultiMediaCard (eMMC) in a mobile phone system.

Example 19 includes subject matter (such as a non-transitory computer readable storage medium including instructions that cause a managed-NAND (M-NAND) testing device to perform acts), or can optionally be combined with one or any combination of Examples 1-18 to include such subject matter, comprising: operating a M-NAND memory device under test by the M-NAND testing device to receive memory access requests from a memory controller of the M-NAND memory device and to provide one or both of status and data in response to the memory access requests at the same rate it receives the memory access requests; monitoring a NAND memory bus of the M-NAND memory device using test pads of the M-NAND memory device; detecting memory operations of the M-NAND memory device under test; advancing the M-NAND testing device through multiple circuit states according to the detected memory operations; and logging memory events of the M-NAND memory device under test according to the circuit states.

In Example 20, the subject matter of Example 19 optionally includes instructions configured to cause the processing circuitry of the testing device to perform acts including: advancing the testing device through the multiple circuit states according to memory commands detected by the M-NAND testing device; and logging the detected memory operations associated with one or more of the memory commands and logging physical memory addresses accessed in association with the detected memory operations.

In Example 21, the subject matter of Example 20 optionally includes instructions configured to cause the processing circuitry of the testing device to display a distribution of types of memory operations according to physical address space.

In Example 22, the subject matter of one or any combination of Examples 19-21 optionally includes instructions configured to cause the processing circuitry of the testing device to perform acts including: detecting memory operations of multiple memory dice of the M-NAND memory device under test; advancing the M-NAND testing device through the multiple circuit states according to memory commands detected by the M-NAND testing device and associated with the detected memory operations; and logging memory accesses to each memory die of the multiple memory dice, logging one or more memory operations associated with a memory access to the memory die, logging a physical address associated with the memory access to the memory die, and logging a status of the memory access to the memory die.

In Example 23, the subject matter of Example 22 optionally includes instructions configured to cause the processing circuitry of the testing device to display one or more of: a number of memory accesses to each memory die of the multiple memory dice; types of memory operations and a number of the types of memory operations associated with the memory accesses to each memory die of the multiple memory dice; physical addresses associated with the memory accesses to each memory die of the multiple memory dice; and status associated with the memory accesses to each memory die of the multiple memory dice.

In Example 24, the subject matter of one or any combination of Examples 19-23 optionally includes instructions configured to cause the processing circuitry of the M-NAND testing device to perform acts including: detecting memory operations communicated via multiple data channels of the M-NAND memory device under test; implementing a finite state machine for each data channel of the multiple data channels; advancing each of multiple finite state machines of the M-NAND testing device through multiple circuit states according to detected memory operations of a corresponding data channel of the multiple data channels; and logging memory events of the multiple data channels according to circuit states of each of the multiple finite state machines.

In Example 25, the subject matter of one or any combination of Examples 19-24 optionally includes instructions configured to cause the processing circuitry of the M-NAND testing device to operate a universal flash storage (UFS) device embedded in a mobile phone system as the M-NAND memory device under test.

These non-limiting examples can be combined in any permutation or combination. The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations.

The scope of the invention should be determined with reference to the appended claims, along with the full scope of equivalents to which such claims are entitled.

The invention claimed is:

1. A testing device comprising:
   test interface circuitry is configured to receive NAND signaling when operatively coupled to a M-NAND memory device under test and to operate the M-NAND memory device under test to receive memory access requests via the NAND signaling and to provide status or data at the same rate it receives memory access requests;
   probe circuitry configured to detect memory operations of the memory device under test; and
   finite state machine circuitry operatively coupled to the probe circuitry and configured to:
      advance through multiple circuit states according to the detected memory operations; and
      log memory events of the memory device under test according to the circuit states.

2. The testing device of claim 1, wherein:
   the probe circuitry is configured to detect NAND memory commands associated with the detected memory operations; and
   the finite state machine circuitry is configured to advance through the multiple circuit states according to the detected NAND memory commands and log the detected NAND memory operations.

3. The testing device of claim 2, wherein:
   the probe circuitry is configured to detect NAND physical memory addresses accessed in association with the detected NAND memory commands; and
   the finite state machine circuitry is configured to log a detected physical memory address in association with a detected NAND memory command.

4. The testing device of claim 3, including processing circuitry and a display, wherein the processing circuitry is configured to display a distribution of types of memory operations performed in a physical address space.

5. The testing device of claim 2,
   wherein the probe circuitry is configured to detect memory operations of multiple memory dice of the memory device under test; and
   wherein the finite state machine circuitry is configured to log memory accesses to each memory die of the multiple memory dice, log one or more commands associated with a memory access to each memory die, log a physical address associated with the memory access to each memory die, and log a status of the memory access to each memory die.

6. The testing device of claim 5, including processing circuitry and a display, wherein the processing circuitry is configured to display one or more of:
   a number of memory accesses to each memory die of the multiple memory dice;
   types of commands and a number of the types of commands associated with the memory accesses to each memory die;
   physical addresses associated with the memory accesses to each memory die; and
   status associated with the memory accesses to each memory die.

7. The testing device of claim 1,
   wherein the test interface circuitry is configured to receive signaling via test pads of the M-NAND memory device to operate a NAND memory bus of the M-NAND memory device as the memory device under test;
   wherein the M-NAND memory device includes multiple data channels internal to the M-NAND memory device and the probe circuitry is configured to detect memory operations communicated via the multiple data channels;
   wherein the finite state machine circuitry includes a finite state machine for each data channel of the multiple data channels of the M-NAND memory device, and each finite state machine is configured to:
      advance through multiple circuit states according to detected memory operations of a corresponding data channel of the multiple data channels; and
      log memory events of the multiple data channels according to the multiple circuit states.

8. The testing device of claim 1, wherein:
   the test interface circuitry is configured to operate the M-NAND memory device under test embedded in an electronic system and receive signaling via test pads of the M-NAND memory device when embedded in the electronic system; and
   the probe circuitry is configured to detect NAND memory access requests from an internal memory controller of the M-NAND memory device embedded in the electronic system.

9. The testing device of claim 8, wherein the electronic system is a mobile phone system.

10. A method of operating a managed-NAND (M-NAND) testing device, the method comprising:
    operating a M-NAND memory device under test to receive memory access requests from a memory controller and to provide one or both of status and data in response to the memory access requests at the same rate it receives the memory access requests;
    monitoring a NAND memory bus of the M-NAND memory device using test pads of the M-NAND memory device;
    detecting memory operations of the M-NAND memory device under test;
    advancing the M-NAND testing device through multiple circuit states according to the detected memory operations; and
    logging memory events of the M-NAND memory device under test according to the circuit states.

11. The method of claim 10,
    wherein the advancing the M-NAND testing device through multiple circuit states includes advancing the M-NAND testing device through the multiple circuit states according to memory commands detected by the testing device; and
    wherein the logging the memory events includes logging the detected memory operations defined by one or more of the memory commands.

12. The method of claim 11, wherein the logging memory events includes logging a physical memory address accessed in association with a detected memory operation.

13. The method of claim 12, including displaying a distribution of types of memory operations performed in a physical address space.

14. The method of claim 10,
    wherein detecting memory operations of the M-NAND memory device includes detecting memory operations of multiple memory dice of the M-NAND memory device under test; and
    wherein the advancing the M-NAND testing device through multiple circuit states includes advancing the M-NAND testing device through the multiple circuit states according to memory commands detected by the M-NAND testing device and associated with the memory operations;

wherein logging the memory events includes logging memory accesses to each memory die of the multiple memory dice, logging one or more memory operations associated with a memory access to the memory die, logging a physical address associated with the memory access to the memory die, and logging a status of the memory access to the memory die.

15. The method of claim 14, including displaying one or more of:
a number of memory accesses to each memory die of the multiple memory dice;
types of memory operations and a number of the types of memory operations associated with the memory accesses to each memory die of the multiple memory dice;
physical addresses associated with the memory accesses to each memory die of the multiple memory dice; and
status associated with the memory accesses to each memory die of the multiple memory dice.

16. The method of claim 10,
wherein operating a M-NAND memory device under test includes operating a universal flash storage (UFS) device or an embedded MultiMediaCard (eMMC) device having multiple data channels internally connecting a memory controller to one or more NAND memory devices;
wherein detecting memory operations of the M-NAND memory device includes detecting memory operations communicated via the multiple data channels;
wherein advancing the M-NAND testing device through multiple circuit states includes advancing each of multiple finite state machines of the testing device through multiple circuit states according to detected memory operations of a corresponding data channel of the multiple data channels; and
wherein logging memory events of the memory device includes logging memory events of the multiple data channels according to circuit states of each of the multiple finite state machines.

17. The method of claim 10, wherein operating a M-NAND memory device under test includes operating a universal flash storage (UFS) device embedded in an electronic system to receive memory access requests from the electronic system and to provide one or both of status and data to the electronic system at the same rate it receives memory access requests.

18. The method of claim 10, wherein operating a M-NAND memory device under test includes operating a universal flash storage (UFS) device or an embedded MultiMediaCard (eMMC) in a mobile phone system.

19. A non-transitory computer readable storage medium comprising instructions configured to cause processing circuitry of a M-NAND testing device to perform acts comprising:
operating a M-NAND memory device under test by the M-NAND testing device to receive memory access requests from a memory controller of the M-NAND memory device and to provide one or both of status and data in response to the memory access requests at the same rate it receives the memory access requests;
monitoring a NAND memory bus of the M-NAND memory device using test pads of the M-NAND memory device;
detecting memory operations of the M-NAND memory device under test;
advancing the M-NAND testing device through multiple circuit states according to the detected memory operations; and
logging memory events of the M-NAND memory device under test according to the circuit states.

20. The non-transitory computer readable storage medium of claim 19, further including instructions configured to cause the processing circuitry of the testing device to perform acts including:
advancing the testing device through the multiple circuit states according to memory commands detected by the M-NAND testing device; and
logging the detected memory operations associated with one or more of the memory commands and logging physical memory addresses accessed in association with the detected memory operations.

21. The non-transitory computer readable storage medium of claim 20, further including instructions configured to cause the processing circuitry of the testing device to display a distribution of types of memory operations according to physical address space.

22. The non-transitory computer readable storage medium of claim 19, further including instructions configured to cause the processing circuitry of the testing device to perform acts including:
detecting memory operations of multiple memory dice of the M-NAND memory device under test;
advancing the M-NAND testing device through the multiple circuit states according to memory commands detected by the M-NAND testing device and associated with the detected memory operations; and
logging memory accesses to each memory die of the multiple memory dice, logging one or more memory operations associated with a memory access to the memory die, logging a physical address associated with the memory access to the memory die, and logging a status of the memory access to the memory die.

23. The non-transitory computer readable storage medium of claim 22, further including instructions configured to cause the processing circuitry of the testing device to display one or more of:
a number of memory accesses to each memory die of the multiple memory dice;
types of memory operations and a number of the types of memory operations associated with the memory accesses to each memory die of the multiple memory dice;
physical addresses associated with the memory accesses to each memory die of the multiple memory dice; and
status associated with the memory accesses to each memory die of the multiple memory dice.

24. The non-transitory computer readable storage medium of claim 19, further including instructions configured to cause the processing circuitry of the M-NAND testing device to perform acts including:
detecting memory operations communicated via multiple data channels of the M-NAND memory device under test;
implementing a finite state machine for each data channel of the multiple data channels;
advancing each of multiple finite state machines of the M-NAND testing device through multiple circuit states according to detected memory operations of a corresponding data channel of the multiple data channels; and logging memory events of the multiple data channels according to circuit states of each of the multiple finite state machines.

25. The non-transitory computer readable storage medium of claim 19, further including instructions configured to cause the processing circuitry of the M-NAND testing device to operate a universal flash storage (UFS) device embedded in a mobile phone system as the M-NAND memory device under test.

* * * * *